(12) United States Patent
Aliman et al.

(10) Patent No.: US 10,236,169 B2
(45) Date of Patent: Mar. 19, 2019

(54) IONIZATION DEVICE WITH MASS SPECTROMETER THEREWITH

(71) Applicant: Carl Zeiss SMT GmbH, Oberkochen (DE)

(72) Inventors: Michel Aliman, Oberkochen (DE); Hin Yiu Anthony Chung, Ulm (DE); Gennady Fedosenko, Aalen (DE); Ruediger Reuter, Aalen (DE); Alexander Laue, Heidenheim (DE); Achim von Keudell, Bochum (DE); Marc Boeke, Hattingen (DE); Thorsten Benter, Haan (DE); Joerg Winter, Niederzier (DE); Peter Awakowicz, Bochem (DE); Leonid Gorkhover, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/617,819

(22) Filed: Jun. 8, 2017

(65) Prior Publication Data
US 2017/0278690 A1    Sep. 28, 2017

Related U.S. Application Data

(63) Continuation of application No. PCT/EP2015/078506, filed on Mar. 12, 2015.

(30) Foreign Application Priority Data

Dec. 16, 2014 (DE) .......................... 10 2014 226 039

(51) Int. Cl.
*H01J 49/14* (2006.01)
*H01J 27/08* (2006.01)
(Continued)

(52) U.S. Cl.
CPC ............ *H01J 49/145* (2013.01); *H01J 27/08* (2013.01); *H01J 37/08* (2013.01); *H01J 49/12* (2013.01)

(58) Field of Classification Search
USPC .................. 250/288, 423 R, 424, 427, 423 F
See application file for complete search history.

(56) References Cited

U.S. PATENT DOCUMENTS

| 5,036,195 | A | | 7/1991 | Batey et al. |
| 6,140,773 | A | * | 10/2000 | Anders ............ H01J 37/32009 204/192.13 |

(Continued)

FOREIGN PATENT DOCUMENTS

| CN | 102263006 A | 11/2011 |
| CN | 202103011 U | 1/2012 |

(Continued)

OTHER PUBLICATIONS

German Office Action, with translation thereof, for corresponding DE Appl No. 10 2014 226 039.6, dated Jul. 16, 2015.

(Continued)

*Primary Examiner* — Kiet T Nguyen
(74) *Attorney, Agent, or Firm* — Fish & Richardson P.C.

(57) ABSTRACT

An ionization device includes: a plasma generating device for generating metastable particles and/or ions of an ionization gas in a primary plasma region; a field generating device for generating a glow discharge in a secondary plasma region; an inlet for supplying a gas to be ionized into the secondary plasma region; and a further inlet for supplying the metastable particles and/or the ions of the ionization gas into the secondary plasma region. A mass spectrometer includes such an ionization device and a detector downstream of the outlet of the ionization device for the mass-spectrometric analysis of the ionized gas.

20 Claims, 2 Drawing Sheets

(51) Int. Cl.
*H01J 37/08* (2006.01)
*H01J 49/12* (2006.01)

(56) References Cited

U.S. PATENT DOCUMENTS

| | | | |
|---|---|---|---|
| 6,949,741 | B2 | 9/2005 | Cody et al. |
| 8,507,850 | B2 | 8/2013 | Whitehouse et al. |
| 8,669,538 | B1 | 3/2014 | Koo et al. |
| 2007/0259111 | A1 | 11/2007 | Singh et al. |
| 2013/0140453 | A1 | 6/2013 | Verenchikov et al. |
| 2014/0060740 | A1 | 3/2014 | Huang et al. |
| 2015/0028222 | A1* | 1/2015 | Denning ................ H01J 27/24 250/424 |
| 2015/0235829 | A1 | 8/2015 | Chung et al. |
| 2017/0125221 | A1* | 5/2017 | Vanhulsel ......... H01J 37/32532 |

FOREIGN PATENT DOCUMENTS

| | | |
|---|---|---|
| CN | 103069538 A | 4/2013 |
| CN | 103215570 A | 7/2013 |
| DE | 3938314 A1 | 5/1990 |
| DE | 19518374 A1 | 11/1996 |
| DE | 102007043333 A1 | 4/2009 |
| DE | 10 2010 020 591 A1 | 11/2011 |
| DE | 102010020591 A1 | 11/2011 |
| DE | 11 2011 102 744 | 7/2013 |
| DE | 2013 201 499 A1 | 7/2014 |
| JP | 11-094802 | 4/1999 |
| JP | 2006-523367 | 10/2006 |
| JP | 2007-33322 | 2/2007 |
| JP | 2007-329110 | 12/2007 |
| KR | 2012-0022549 | 3/2012 |
| TW | 201315836 A | 4/2013 |
| TW | 201409526 A | 3/2014 |
| TW | 201442055 A | 11/2014 |
| WO | WO 2014/118122 | 8/2014 |

OTHER PUBLICATIONS

Taiwanese Office Action and Search Report, with translation thereof, for corresponding TW Appl No. 104141567, dated Nov. 15, 2016.
International Search Report and Written Opinion for corresponding PCT Appl No. PCT/EP2015/078506, dated Feb. 2, 2016.
Vizier et al., "Broad-beam high-current dc ion source based on a two-stage glow discharge plasma$^{a)}$," Review of Scientific Instruments, AIP, vol. 81, Feb. 5, 2010.
Gavrilov et al, "Glow-discharge-driven bucket ion source," Review of Scientific Instruments, AIP, vol. 75, No. 5, May 1, 2004, pp. 1875-1877.
Korean Office Action, with English translation thereof, for corresponding Appl No. 10-2017-7019721, dated May 18, 2018.
Chinese Office Action, with translation thereof, for corresponding CN Appl No. 2015-80068638, dated Feb. 27, 2018.
Japanese Office Action, with translation thereof, for corresponding JP Appl No. 2017-532665, dated Apr. 2, 2018.
Japanese Office Action, with translation thereof, for corresponding JP Appl No. 2017-532665, dated Aug. 14, 2018.
Korean Office Action, with translation thereof, for corresponding KR Appl No. 10-2017-7019721, dated Nov. 30, 2018.

* cited by examiner

IONIZATION DEVICE WITH MASS SPECTROMETER THEREWITH

CROSS-REFERENCE TO RELATED APPLICATIONS

The present application is a continuation of, and claims benefit under 35 USC 120 to, international application PCT/EP2015/078506, filed Dec. 3, 2015, which claims benefit under 35 USC 119 of German Application No. 10 2014 226 039.6, filed Dec. 16, 2014. The entire disclosure of international application PCT/EP2015/078506 and German Application No. 10 2014 226 039.6 are incorporated by reference herein.

FIELD

The disclosure relates to an ionization device and a mass spectrometer with such an ionization device.

BACKGROUND

Novel approaches for ionizing gases to be ionized (which are occasionally also referred to as analytes below), which are able to complement or—depending on the application—even able to replace the standard processes for ionization with a hot filament or glow wire (electron ionization), are used in mass spectrometry. The disadvantages of the standard ionization are the high surrounding temperature of the filament, which is up to 2000° C. hot, and the ionization energy of typically approximately 70 eV, which is too high for most applications, particularly in organic chemistry (e.g. life sciences), and which leads to the generation of fragments, as well as the very high susceptibility of the filament in the case of high work pressures of typically more than approximately $10^{-4}$ mbar, which can lead to the filament "burning through".

DE 10 2007 043 333 A1 has disclosed a method for treating and examining components, wherein a primary plasma beam generated in a cold atmospheric plasma source is used as an ignition source for a secondary plasma beam to be generated in a cavity to be conditioned or examined with a small diameter. To this end, a noble gas is guided through the cavity of the component in the direction of the primary plasma source. Here, the secondary plasma ignited by the primary plasma source propagates against the gas flow direction of the noble gas in the cavity of the component to be treated or examined.

SUMMARY

The disclosure seeks to provide an ionization device and a mass spectrometer with an ionization device, which enable an efficient ionization of a gas.

In one aspect, the disclosure provides an ionization device, including: a plasma generating device for generating (charge-neutral) metastable particles and/or ions of an ionization gas in a primary plasma region, a field generating device for generating a glow discharge in a secondary plasma region, an inlet for supplying a gas to be ionized into the secondary plasma region, and a further inlet for supplying the metastable particles and/or the ions of the ionization gas into the secondary plasma region. When the spatial extent of the glow discharge is described, the glow discharge is often also referred to as glow discharge zone below. Within the meaning of this application, the secondary plasma region denotes not only the glow discharge zone itself, in which the (secondary) plasma is formed, but also a space around the glow discharge zone, which is formed in an interior of a housing of the ionization device and in which, for example, an electric field can be applied to generate the glow discharge (see below).

Typically, a micro plasma, in particular a so-called "cold" micro plasma at temperatures of typically less than approximately 200° C., is generated in the primary plasma region of the plasma generating device, i.e. a filament for generating the plasma is dispensed with. The plasma generating device can be embodied in particular to generate mainly charge-neutral metastable particles or molecules of the ionization gas, for example in the form of metastable noble gas molecules, in particular in the form of metastable helium molecules. Firstly, this enables a gentle ionization of the gas (the analyte) to be ionized with energies that typically lie in the region of approximately 20 eV; secondly, such a plasma generating device also operates very robustly and reliably at a high analyte pressure.

The metastable particles/molecules and/or the ions of the ionization gas are supplied to the secondary plasma region by way of the further inlet or the aperture thereof. The metastable particles/molecules and/or the ions of the ionization gas can be supplied via the further inlet in the glow discharge zone; however, it is also possible to supply the metastable particles/molecules and/or the ions of the ionization gas to the secondary plasma region at a position outside of the glow discharge zone, for example in a region in which an electric field is typically applied as an ignition path for the ignition of the glow discharge (see below). The gas to be ionized is likewise supplied to the secondary plasma region by way of an appropriate aperture of the (first) inlet. Some of the molecules of the gas to be ionized are ionized by the metastable particles/molecules or by the ions of the ionization gas by way of a charge exchange ionization or by way of a collision process.

Additional molecules of the gas to be ionized are ionized particularly efficiently via the glow discharge, generated by the field generating device, in the secondary plasma region. A suitable (gas) pressure is set in the secondary plasma region for the purposes of generating the glow discharge (see below). What is advantageous for the purposes of generating the glow discharge in the secondary plasma region is that free electrons are produced during the impact ionization of the gas to be ionized with the ions or with the metastable particles of the ionization gas, which free electrons generate successively more free electrons in the analyte gas on their path in the direction of the glow discharge zone by way of cascade multiplication or the avalanche effect, enabling a particularly high ionization efficiency in the glow discharge zone; in other words, this process leads to a very high electron density being present in the glow discharge zone.

In one embodiment, the field generating device is embodied to generate an electric field between the inlet and the further inlet for generating the glow discharge in the secondary plasma region. The electric field forms an acceleration path or an ignition path for accelerating electrons, proceeding from the inlet to the region of the further inlet. The electrons which were accelerated in the secondary plasma region in the direction of the glow discharge zone have a high kinetic energy and can therefore ionize additional molecules of the gas to be ionized particularly efficiently. The further inlet, more precisely a central axis of the further inlet which extends through the aperture of the further inlet, is preferably aligned at an angle, e.g. at an angle of 90°, in relation to the inlet, more precisely to a central axis of the inlet, and hence to the propagation direction of the gas to be ionized. The central axes of the inlet and of the further inlet intersect in the secondary plasma region, generally in the glow discharge zone or in the vicinity of the glow discharge zone.

In a development, the field generating device has a voltage source and two electrodes for generating the electric field. An electric field, which forms an ignition path or an acceleration path for generating the plasma, is generated by applying a voltage between a first electrode, which serves as a cathode, and a second electrode, which serves as an anode. In order to accelerate the electrons toward the glow discharge zone, the electrode serving as an anode is typically arranged closer to the glow discharge zone than the electrode serving as a cathode. The voltage applied between the electrodes is typically selected to be so large that it corresponds to an ignition voltage sufficient for igniting a plasma, i.e. it enables a cascade multiplication or an avalanche effect, in which further electrons are generated by the ionization of the molecules of the gas to be ionized, which further electrons are likewise accelerated and able to ionize further molecules of the gas to be ionized.

The voltage for igniting a plasma can be determined from Paschen's law or the Townsend equation for a given distance between the electrodes and a given gas pressure in the region between the electrodes. The product of gas pressure and distance between the electrodes is typically selected in such a way that the so-called Paschen minimum is reached for the respective gas to be ionized, i.e. so that the minimum possible ignition voltage can be selected.

In a further development, the inlet forms a first electrode (cathode) and the further inlet forms a second electrode (anode) for generating the electric field. In this way, the whole path between the inlet and the further inlet can be used as acceleration path or as ignition path for igniting the plasma. It is understood that it is optionally also possible to use electrodes that are arranged with spatial separation from the inlet and the further inlet for the purposes of generating the electric field. As an alternative or in addition to using the further inlet as a second electrode, it is also possible to use a further outlet for pumping the gas, the metastable particles of the ionization gas and/or the ions of the ionization gas out of the secondary plasma region. In particular, the further inlet and the further outlet, between which the secondary plasma region is formed, can serve together as second electrodes for generating the electric field.

In a further development, the voltage source is embodied to generate a voltage between 50 V and 5000 V between the first electrode and the second electrode. As described further above, the ignition voltage for generating a glow discharge or a plasma depends on the typically fixedly predetermined distance between the electrodes, on the gas pressure along the ignition path and on the gas to be ionized, in particular on the ionization energy of the respective gas atoms or gas molecules and on the mean free path length. The latter depends, inter alia, on the size of the gas atoms and the density thereof, as well as on the temperature. Voltages within the aforementioned region are generally sufficient to generate a glow discharge.

In a further embodiment, the ionization device includes an outlet for the discharge of the ionized gas from the ionization device. The outlet is typically arranged on the side of the secondary plasma region or of the glow discharge zone distant from the inlet. The ions or the ion beam generated by the ionization device can serve to analyse the ionized gas, e.g. in a mass spectrometer.

However, it is also possible to use the ions or the ion beam generated by the ionization device for other applications, for example in electron beam or ion beam microscopy (e.g. in a helium ion microscope), in which an electron beam or an ion beam scans the object (sample) to be examined. In the first case, it is possible e.g. for the electrons of the ionization device, back-scattered at the object to be examined, to be supplied via the inlet together with a gas to be ionized, e.g. a noble gas, in particular helium, or water vapour. A detector (e.g. a light-sensitive amplifier or a charge amplifier) can be disposed downstream at the output of the ionization device, e.g. at earth potential or at low potentials in the vicinity of the earth potential: Hence, in the case of a suitable design of the flight of the electrons, which can be selected e.g. to be much longer than the flight of the cations of the gas to be ionized in the ionization device, it is surprisingly possible to achieve a high mean mobility, despite the subsequent "slow" ion detection. In other words, a high detection efficiency with a correspondingly high signal bandwidth of the back-scattered electrons from the sample can be achieved using conventional detector electronics operating at earth potential. The acceleration or ignition path in the ionization device in this case serves to amplify the electron current generated by the electrons or to increasingly generate ions generated by the electron current. The gain of the electron current can be set by the length of the ignition path.

As a result of the comparatively high pressure in the secondary plasma region, the ions which pass through the outlet have little kinetic energy ("cold plasma"), which is advantageous for an ion transfer device disposed downstream of the outlet and which enables an efficient ion transfer. The outlet can form a single (optionally multiple) pressure stage for reducing the pressure of the ionized gas and/or an ion transfer path, with a detector or a mass analyser being disposed downstream thereof.

In a further embodiment, the field generating device is embodied to generate a further electric field between the further inlet and the outlet. The further electric field is typically directed in a manner opposite to the electric field which forms the ignition path for the electrons. Via the additional electric field, positively charged ions generated in the secondary plasma region are accelerated out of the secondary plasma region to the outlet or to an aperture formed there, and leave the ionization device. As most ions of the gas to be ionized are generated at the end of the ignition path or in the glow discharge zone because the density of the free electrons is at a maximum there, the majority of the ions can thus be discharged from the ionization device by way of the outlet.

The second electrode (cathode), which is used to generate the (first) electric field, can also be used to generate the further electric field. The electric field can be generated by applying a voltage to this electrode and to a further electrode which is arranged in the vicinity of the outlet. The voltage used for the voltage punch-through can have approximately the same order of magnitude of the ignition voltage in terms of size; however, as described further above, the punch-through voltage has the opposite sign to the ignition voltage.

In a development, the outlet forms a further electrode for generating the further electric field. In this case, the ions of the ionized gas can be accelerated towards the outlet in a particularly simple manner. Preferably, the outlet forming the further electrode is earthed, i.e. placed at ground potential (0 V). In this case, the detector can lie at ground potential, for example when using the ionization device in an electron or ion microscope, which was found to be advantageous for realizing a simple and powerful amplifier design (e.g. in the form of a charge amplifier or a photodiode amplifier). It can also be advantageous to place the outlet at ground potential when using the ionization device in a mass spectrometer.

In a further advantageous embodiment, the inlet, the secondary plasma region and the outlet of the ionization device are arranged along a common line of sight. This is advantageous for realizing a compact arrangement of the ionization device. Unlike in the case where a molecular beam is used, an arrangement along a line of sight is not mandatory in the present ionization device, however. For realizing a constant ion yield, it was found to be advantageous if a substantially constant static (intermediate) pressure prevails in the secondary plasma region, ideally in the whole space along the line of sight between the inlet and the outlet.

In a development, the ionization device additionally includes a pumping-out device with a further outlet for pumping the gas to be ionized or already partly ionized gas, the metastable particles of the ionization gas and/or the ions of the ionization gas out of the secondary plasma region. The further outlet serves to pump out excessive gas from the secondary plasma region. In this manner, it is possible to generate a substantially constant pressure in the secondary plasma region, which pressure is substantially caused by the analyte gas molecules. The generation of a substantially constant ion yield can be ensured by the substantially constant pressure. As described further above, the pumping-out device with the further outlet can, as an alternative or in addition to the further inlet, also serve as second electrode for generating the electric field between the inlet and the glow discharge zone.

In one development, the further inlet and the further outlet are arranged along a further line of sight. In particular, the further line of sight can be arranged at right angles to the line of sight between the inlet and the outlet. The secondary plasma region, typically the glow discharge zone, is formed between the further inlet and the further outlet. In this case, the further inlet and the further outlet can serve as (second) electrodes which are placed at the same potential in order to form an electric field for accelerating electrons or for generating a plasma between the inlet and the glow discharge zone.

In a further embodiment, the field generating device is embodied to generate at least one magnetic field in the secondary plasma region. A magnetic field applied in the secondary plasma region, in particular a time-dependent magnetic field, can amplify the ionization, for example by way of the "electron cyclotron resonance" (ECR) effect or by an "inductively coupled plasma" (ICP effect). By way of example, a time-dependent electric field, which acts on the plasma in a suitable manner or amplifies the latter, can be generated by using a time-dependent magnetic field. The ionizing magnetic field can be coupled in via one or more permanent magnets or via one or more coils, which e.g. can be applied at the same positions as the coils. It is understood that the magnetic (electromagnetic) field prevails in the secondary plasma region so that the ionization can be influenced there in an amplified or targeted manner.

The plasma or the glow discharge zone can also be displaced in a targeted manner within the ionization device with the aid of at least one magnetic field, for example by virtue of these being displaced in a targeted manner to the inlet for the gas to be ionized or to other openings (apertures), for example in the direction of the outlet, or by virtue of these being concentrated in a specific region within the ionization device in order to ionize the molecules of the gas to be ionized with the highest possible efficiency there or in order to design the ion conveyance to the outlet and to a measuring cell optionally adjoining the outlet in the most efficient manner possible. This procedure can also be used in a targeted manner for different analytes to increase the ionization efficiency, i.e. the at least one magnetic field can be influenced or modified depending on the type of gas to be ionized.

The ionizing time-dependent magnetic field can also be modified or moved in a targeted manner in a measuring cell or in a detector during a measuring procedure of an analyte, which may lead to increasing the ionization or to more efficient conveyance of ions into the measuring cell.

As described further above, the at least one magnetic field, in particular in the form of an alternating magnetic field, can be generated in a desired form in order to increase the ionization efficiency or to influence the latter in a targeted manner. In one development, the field generating device is embodied to generate a magnetic field aligned along the line of sight or along the further line of sight, i.e. a magnetic field which extends along the line of sight or along the further line of sight and has an axis of symmetry there.

In a further embodiment, the ionization device additionally includes a chamber, arranged between a primary inlet of the ionization device and the inlet, for treating the gas to be ionized prior to supplying the gas to be ionized into the secondary plasma region. The gas to be ionized can be treated in the chamber before the gas is discharged from the inlet into the secondary plasma region. The gas to be ionized can be treated in various ways:

By way of example, there can be a pressure reduction of the gas to be ionized in the chamber, i.e. the chamber serves as e.g. a differentially pumped chamber, or as a chamber pumped (pulsed) via a valve, for reducing a primary environmental pressure in a (vacuum) environment outside of the ionization device, which environmental pressure may e.g. be of the order of between approximately 1 bar and 200 bar. Depending on the primary environmental pressure, the pressure reduction in the chamber can be brought about via a simple pressure stage or by way of a plurality of pressure stages arranged in series in order to be able to carry out the ionization at a smaller analyte pressure. First of all, this reduces a large chemical reactivity of the analyte during and after the ionization and, secondly, ensures unchanging ionization conditions.

There can also be thermal decoupling in the chamber in order to ensure that the temperature of the gas to be ionized, which enters from a (vacuum) environment disposed upstream of the primary inlet, does not exceed a fixedly predetermined maximum operating temperature in the inlet adjoining the chamber. The thermal decoupling can be brought about by thermal insulation (metal/ceramic transition), passive cooling (e.g. convection by way of cooling bodies), active cooling (e.g. air or water cooling), etc.

Additionally or alternatively, it is also possible to carry out foreign gas suppression, particle filtering and/or a particle treatment in the chamber in order to convert the gas to be ionized into a composition suitable for supply to the secondary plasma region. The particle treatment or particle filtering can be carried out e.g. in a mechanical or magnetic manner.

In a further embodiment, a pressure in the primary plasma region is greater than a pressure in the secondary plasma region. This is advantageous so that the metastable particles and/or ions of the ionization gas from the primary plasma region can be transferred to the secondary plasma region through the further inlet, without it being necessary to provide pumps or the like for this purpose.

In an advantageous development, the pressure in the primary plasma region lies between 100 mbar and 1000 mbar. A plasma generating device in which such a pressure prevails typically does not have a filament (heating cathode), since filaments, e.g. made of tungsten or iridium, are typically only usable below a pressure of less than approximately $10^{-4}$ mbar and have a short service life. Moreover, very high temperatures of e.g. more than approximately 2000° C. are generally produced when using heating cathodes or filaments.

Using the plasma generating device operating in the pressure range specified above, it is possible to generate a primary plasma (micro plasma) of an ionization gas in a different manner than by way of a heating cathode—for example in the manner as described further below. Such a plasma generating device operates very reliably, even at different pressures. If a so-called "cold plasma" is generated at comparatively low temperatures of 10° C. to 200° C., it is possible to mainly generate charge-neutral metastable molecules in the primary plasma region, which metastable molecules are emitted from the primary plasma region to the secondary plasma region. The ionization gas is immediately pumped away again by the plasma generating device in such a way that a low static gas pressure can set-in in the secondary plasma region.

In a further development, the pressure in the secondary plasma region lies between 0.5 mbar and 10 mbar. Such a (static) pressure level was found to be advantageous for generating the secondary plasma. As described further above, the pressure in the secondary plasma region is substantially generated by the analyte. The pumping-out device serves to pump out excessive gas, in particular excessive analyte gas, and thus generate a substantially constant pressure in the secondary plasma region.

An open-loop and/or closed-loop control device can be arranged in the ionization device for generating a (substantially) constant pressure in the secondary plasma region. The open-loop and/or closed-loop control device can e.g. actuate a (micro-)valve, for example in the form of a microsecond piezo-driven microvalve, arranged at the inlet. By way of example, the pressure regulation can be achieved by multiple opening of the (micro-) valve, e.g. by gas pulse width modulation, in combination with differential pumping out of the secondary plasma region. In general, at least one pressure sensor for measuring the pressure in the primary plasma region, in the secondary plasma region and/or in the region of the pumping-out device is assigned to the open-loop and/or closed-loop control device for the purposes of regulating the pressure in the secondary plasma region to a setpoint value.

In a further embodiment, the ionization gas of the plasma generating device is a (preferably pure) noble gas, in particular helium, which has a small molecular size. The use of other ionization gases, e.g. noble gases, such as Ar, Kr, or oxygen ($O_2$) is also possible. By way of example, substantially metastable helium molecules, which enable a gentle ionization of the analyte, can be formed in the primary plasma region in the case of the suitable selection of process conditions. The plasma generating device may optionally include a chopper in order to enable pulsed plasma operation. However, in the application described here, it is typically advantageous if a substantially constant volumetric flow of metastable particles and/or ions of the ionization gas is supplied to the secondary plasma region. When using a noble gas as ionization gas, in particular when using helium as ionization gas, the portion of generated metastable particles (e.g. metastable helium molecules) relative to the portion of generated ions is particularly high. By way of example, when using helium, the number of generated metastable particles can be greater than the number of generated ions by a factor of $10^4$ or $10^5$, and so the plasma generating device practically only generates metastable particles (i.e. practically no ions) in the primary plasma region.

In a further embodiment, the plasma generating device is selected from the group including: corona discharge plasma generating device and dielectric barrier discharge plasma generating device. In particular, the plasma generating device can be embodied as an atmospheric pressure plasma source, i.e. a pressure in the pressure range, specified further above, between approximately 100 mbar and 1 bar can prevail therein. By way of example, a radiofrequency discharge can be ignited between two electrodes in order to generate a corona discharge for the purposes of generating atmospheric pressure plasmas. One of the electrodes can be arranged in an interior of the plasma generating device while the second electrode forms the housing or the further inlet for supplying the metastable particles and/or ions of the ionization gas into the secondary plasma region. The further inlet typically has an opening (aperture) for supplying the metastable particles and/or the ions into the secondary plasma region.

As described further above, e.g. helium can be used as ionization gas; however, operation at different pressures and with other gases is also possible. The amount of the ionization gas flowing out of the plasma generating device, for example in the form of helium, is specified by the pressure conditions within the plasma generating device and outside of the plasma generating device, for example in the secondary plasma region, and by the diameter of the opening (aperture) of the further inlet. The diameter of the opening (aperture) can e.g. lie in the range between 1 μm and 100 μm; however, other diameters are also possible.

The above-described plasma generating device can be modified to generate a radiofrequency dielectric barrier discharge. In this type of excitation, a (thin) dielectric, which serves as dielectric barrier, is situated between the electrodes in order to generate a plasma in the form of a multiplicity of spark discharges and thus ionize a gas flow situated between the electrodes.

Non-conductive components, in particular dielectric components, can also be used to restrict the plasma to a specific volume. By way of example, a further, non-conductive stop, in particular a dielectric stop, with a corresponding aperture can be arranged between the first electrode and the opening (aperture) of the second electrode. However, this is not mandatory for the basic functionality of the plasma generating device. Further boundaries of the plasma in the plasma generating device by way of non-conductive materials, in particular dielectric materials, may likewise be advantageous.

In place of a radiofrequency plasma, it is also possible to generate a mid-frequency plasma or a DC plasma in the plasma generating device in order to ionize an ionization gas or an ionization gas mixture, wherein a "cold plasma" can likewise be generated in the pressure range specified above.

It is also possible for the plasma generating device to have a UV radiation source for generating UV radiation for ionizing an ionization gas. In this case, the UV radiation can optionally also be generated directly in the chamber of the plasma generating device, in which the ionization gas is also ionized, such that light intensity losses can be avoided and a very efficient ionization by way of the UV radiation can be achieved. In particular, it is not necessary to guide the UV radiation, generated by a UV radiation source, e.g. a UV lamp, into the chamber through a window and optionally via a deflection device, which would be associated with losses in the radiation intensity. Moreover, conventional UV lamps typically only have a short service life and are comparatively large.

Very gentle ionization can be brought about by the UV radiation since, due to the relatively large effective cross sections thereof, e.g. ions or metastable particles, which have a relatively low ionization energy of approximately 18-24 eV, have a significantly better ionization efficiency than e.g. in the case of electron impact ionization (see below) at e.g. 70 eV.

A further option for generating ions consists of using one or more field emitters or field emitter arrays, e.g. in the form of "cold" electron guns, as an ionization device for carrying out electron impact ionization. In contrast to a filament, field emitters have an almost unlimited service life and can therefore be used significantly longer than filaments. This is advantageous, particularly in the case of use in an oxidizing atmosphere (e.g. in an oxygen atmosphere) or in the case of an unexpected pressure increase, e.g. to more than approximately $10^{-4}$ mbar. Moreover, in contrast to heating cathodes or filaments, field emitters have a low temperature such that the temperature problems occurring in the case of filaments can be solved completely by the use of field emitters. The field emitters can be embodied for generating focussed or directed electron beams. It is optionally possible to set or vary the kinetic energy of the accelerated electrons.

The metastable particles or ions generated by the plasma, possibly further particles generated by the plasma, the reaction products thereof and radiation, e.g. UV radiation, as well as the plasma itself can leave the plasma generating device or the further inlet through the opening (aperture) and ionize the analyte in the secondary plasma region. Here, typical ionization mechanisms are: impact-induced ionization, charge exchange between ions and neutral particles, ionization via metastable particles, chemical ionization, photoionization, in particular ionization via UV radiation, etc.

A further aspect of the disclosure relates to a mass spectrometer, including: an ionization device as described further above and a detector disposed downstream of the outlet of the ionization device, for the mass-spectrometric analysis of the ionized gas. The detector can immediately adjoin the outlet; however, it is also possible for an ion transfer device and/or one or more pressure stages to be arranged between the outlet and the detector. As described further above, the ionization device described here is not restricted to the use in a mass spectrometer; rather, it can also be applied advantageously to other applications, for example for generating ions for detecting electrons or an electron current in electron beam microscopy or for generating ion beams for ion beam microscopy.

Further features and advantages of the disclosure emerge from the following description of exemplary embodiments of the disclosure, on the basis of the figures in the drawing, which show details of the disclosure, and from the claims. The individual features can be realized respectively on their own or together in any combination in one variant of the disclosure.

BRIEF DESCRIPTION OF THE DRAWINGS

Exemplary embodiments are depicted in the schematic drawing and are explained in the subsequent description in connection with the figures, in which.

DESCRIPTION OF EXEMPLARY EMBODIMENTS

Identical reference signs are used in the following description of the drawings for equivalent or functionally equivalent components.

Figure 1A:
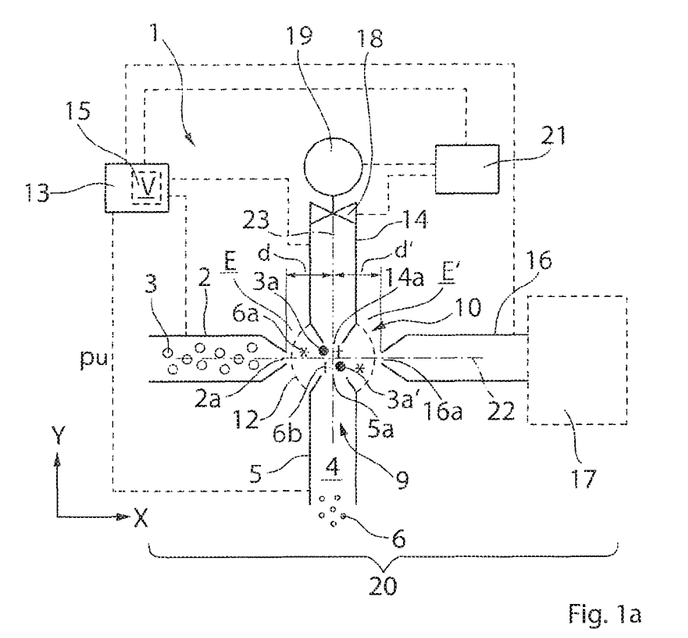
FIG. 1a shows a schematic illustration of an ionization device with a plasma generating device for generating a plasma in a primary plasma region and with an acceleration path for generating a glow discharge or a plasma in a secondary plasma region.

FIG. 1a schematically shows an ionization device 1 which includes an inlet 2 for supplying a gas 3 to be ionized, the gas originating from an environment, not shown in any more detail in FIG. 1a, in which an environmental pressure $p_U$ prevails. The inlet 2 and the (further) inlets and outlets described below are understood to mean a housing or a housing part with an interior, in which a gas—the gas 3 to be ionized in the present case—is supplied in a manner shielded from the surroundings. It is understood that the ionization device 1 itself has a housing (not shown here) in order to separate the interior thereof from the environment.

The ionization device 1 also includes a plasma generating device 4, which is housed within a further inlet 5. The plasma generating device 4 serves to generate metastable particles 6a and/or ions 6b of an ionization gas 6, which may e.g. be present in the form of helium, in a manner described in more detail below in conjunction with FIG. 2.

Figure 2:
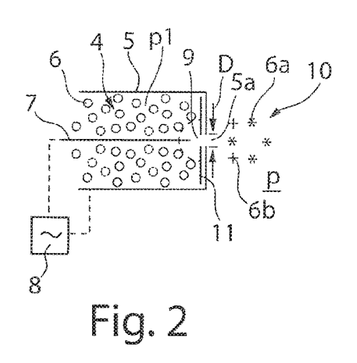
FIG. 2 shows an illustration of an exemplary embodiment of the plasma generating device from FIGS. 1a,b in the form of a corona discharge plasma generating device.

FIG. 2 shows the further inlet 5, which has a substantially (circular) cylindrical embodiment in the shown example and at the planar end sidewall of which an opening (aperture) 5a is formed, through which the metastable particles 6a and/or the ions 6b of the ionization gas 6 can pass. In the shown example, the plasma generating device 4 is embodied as a corona discharge plasma generating device and has a rod electrode 7 arranged centrally in an interior of the further inlet 5. The further inlet 5 forms a further electrode of the plasma generating device 4, which has an RF voltage source 8 for generating an alternating radiofrequency electric field between the rod electrode 7 and the further inlet 5 serving as an electrode.

A plasma can be generated via the plasma generating device 4 in a primary plasma region 9 directly at the opening (aperture) 5a of the further inlet 5 such that the metastable particles 6a and/or the ions 6b of the ionization gas 6 can be supplied directly, i.e. without an ion transport device, to a secondary plasma region 10 through the opening (aperture) 5a of the further inlet 5. It is understood that the plasma generating device 4 need not necessarily be integrated in the further inlet 5; rather, it can also be arranged in a spatially separated manner from the further inlet 5 for as long as a suitable ion transport device, e.g. in the form of ion optics or the like, is present for transporting the metastable particles 6a and/or the ions 6b.

The ionization gas 6 can be helium in particular; however, other noble gases, e.g. Ar or Kr, or other gases, e.g. oxygen ($O_2$), can also serve as ionization gas 6. Particularly the use of helium as ionization gas 6 enables a gentle ionization of the gas (the analyte) to be ionized with energies that typically lie in the region of approximately 20 eV. An advantageous effect here is that the portion of generated metastable particles 6a (metastable helium molecules) is significantly larger than the portion of generated helium ions 6b (approximately by a factor of $10^4$ to $10^5$) when using helium as ionization gas 6.

In the plasma generating device 4 described in conjunction with FIG. 2, the (static) pressure $p_1$ in the primary plasma region 9 typically lies between approximately 100 mbar and 1000 mbar, which is why the plasma generating device 4 shown there is also referred to as atmospheric pressure plasma generating device. The static pressure $p_1$ in the primary plasma region 9 is greater than the static pressure p in the secondary plasma region 10, which is situated outside of the further inlet 5. Typical values for the (static) pressure p in the secondary plasma region 10 lie between approximately 0.5 mbar and approximately 10 mbar. The number of metastable helium particles or helium molecules being discharged per unit time is determined by the pressure conditions within the plasma generating device 4 or in the primary plasma region 9 and in the secondary plasma region 10, as well as by the diameter D of the aperture 5a of the further inlet 5. By way of example, the aperture diameter D can lie in a value range between approximately 1 μm and 100 μm; however, the aperture diameter D may optionally also be larger or smaller. The plasma generating device 4 can also have a pump device (not shown here), which immediately pumps out the ionization gas 6, e.g. helium, again such that the latter does not reach the secondary plasma region 10 and a lower (gas) pressure p than in the primary plasma region 9 sets-in in the secondary plasma region 10.

A peculiarity of the plasma generating device 4 shown in FIG. 2 is that a further stop 11 is arranged at the planar end side of the further inlet 5, at which the aperture 5a is formed, which further stop is manufactured from a non-conductive, e.g. dielectric material and serves to substantially restrict the plasma or the primary plasma region 9 to the interior of the further inlet 5. It is understood that further components made of a non-conductive, more particularly dielectric material can also be arranged in the interior of the inlet 5 or in the plasma generating device 4, and can be used as restrictions for the primary plasma or for the primary plasma region 9.

In place of the plasma generating device 4 shown in FIG. 2, it is also possible to use a different type of plasma generating device 4 in the ionization device 1, for example a plasma generating device 4 which generates a plasma by UV radiation or, optionally, in a different manner. It was found to be advantageous if the plasma generating device 4 can generate a (micro-)plasma with a comparatively large static pressure and if the device is embodied to generate a "cold plasma" at temperatures that lie at no more than approximately 200° C.

The metastable particles or molecules 6a and/or the ions 6b, supplied to the secondary plasma region 10 through the further inlet 5, serve to ionize the gas 3 to be ionized, which was supplied by the inlet 2, which gas to be ionized is also referred to as an analyte below. At least some of the molecules of the gas 3 to be ionized (a gas is also understood to mean a gas mixture within the meaning of this application) are ionized in the secondary plasma region 10 by the metastable particles 6a and/or by the ions 6b of the ionization gas 6 such that ions 3a' of the gas 3 to be ionized (also referred to as ionized gas 3a' below) are generated in the secondary plasma region 10. The molecules of the gas 3 to be ionized can be ionized by way of the metastable particles 6a or the ions 6b of the ionization gas 6 by way of e.g. charge-exchange ionization, by impact-induced ionization, etc.

Figure 1B:
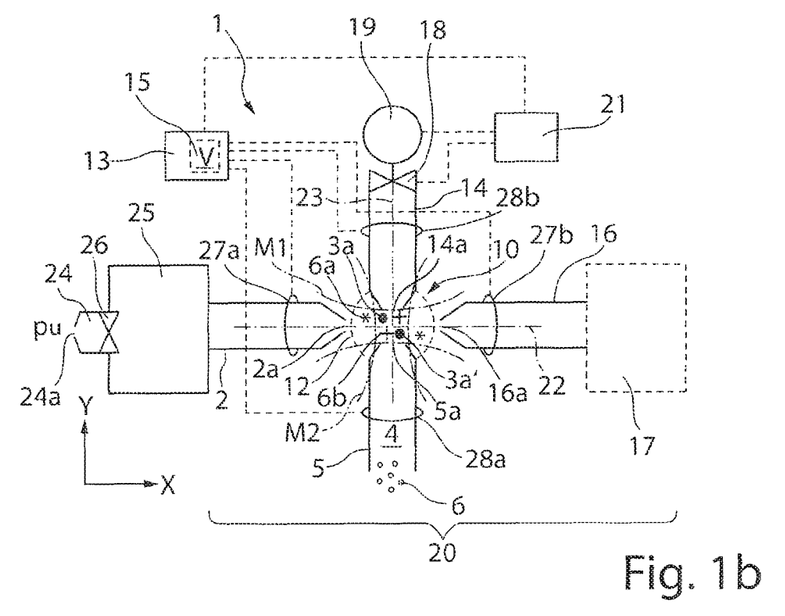
FIG. 1b shows an illustration analogous to FIG. 1a, with an additional chamber for treating a gas to be ionized and with a field generating device for generating magnetic fields in the secondary plasma region.

In addition to the ionization of the gas 3 by the metastable particles 6a and/or ions 6b supplied from the primary plasma region 9, an ionization of the gas 3 is generated in the secondary plasma region 10 by a glow discharge 12 or a glow discharge zone (cf. FIGS. 1a,b), i.e. of a (secondary) plasma in the secondary plasma region 10. Here, it was found to be advantageous if at least some of the molecules of the gas 3 are ionized by a collision process such that free electrons form in the secondary plasma region 10. In order to generate the glow discharge 12 in the secondary plasma region 10, the ionization device 1 has a field generating device 13 which, in the shown example, is embodied to generate an electric field E for generating the glow discharge 12 between the inlet 2 and the further inlet 5 and a further outlet 14, which is arranged level with the further inlet 5 in a direction (Y-direction) perpendicular to the direction of propagation (X-direction) of the gas 3 to be ionized. To this end, the field generating device 13 has a voltage source 15, which is connected both to the inlet 2 serving as a first electrode (cathode) and to the further inlet 5, as well as to the further outlet 14. The further inlet 5 and the further outlet 14 lie at the same electric potential and therefore together form a second electrode 5, 14 (anode). The voltage source 15 is embodied to generate an electric field E with a direction that accelerates electrons from the inlet 2 in the direction of the glow discharge zone 12, i.e. in the direction of the further inlet 5 or of the further outlet 14. Here, the electrons are accelerated along an acceleration or ignition path d, which extends in the X-direction, i.e. along the propagation direction of the gas 3 to be ionized.

Figure 3:
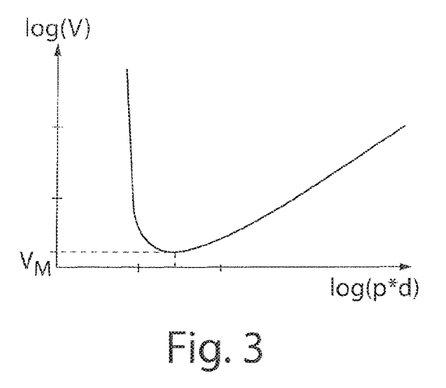
FIG. 3 shows an illustration of the Paschen curve of the ignition voltage of a plasma as a function of the product of gas pressure and electrode spacing.

The length of the ignition path d corresponds to the distance between the inlet 2 and the central axis of the further inlet 5, which extends centrally through the aperture 5a thereof, and the distance between the inlet 2 and the central axis of the further outlet 14, which extends centrally through the opening (aperture) 14a thereof. By way of example, the length of the ignition path d can lie between approximately 10 mm and a number of centimeters. The voltage V generated with the aid of the voltage source 15 and the (quasi static) pressure p in the intermediate space between the inlet 2 and the further inlet 5 or the further outlet 14 are selected in such a way in the case of the typically constant length of the ignition path d that the so-called Paschen minimum $V_M$ is approximately reached, i.e., the minimum possible value for the ignition voltage V for a given gas species to be ionized (cf. FIG. 3). There is a cascade multiplication of the free electrons along the ignition path, which free electrons are generated during the ionization via the ionization gas 6 such that a (positive) electric field strength of the electric field E is exceeded in the secondary plasma region 10, which electric field strength is for the formation of a glow discharge 12 or a glow discharge zone. Typically, the voltage V which is for generating the glow discharge 12 and supplied by the voltage source 15 lies between approximately 50 V and approximately 5000 V. It is understood that the voltage source 15 can be embodied to set the voltage V in order to adapt the ionization device 1 to different gases 3 or gas species to be ionized.

The glow discharge 12 in the secondary plasma region 10 leads to the particularly efficient ionization of additional molecules of the gas 3 to be ionized (referred to below as ions 3a or as ionized gases 3a). The gas 3a' ionized by the ionization gas 6 is supplied to an outlet 16, more specifically to an aperture 16a formed there, together with the gas 3a ionized by the glow discharge 12. In the example shown in FIG. 1a, a detector 17 embodied for the mass spectrometric examination of the ionized gas 3a, 3a' adjoins the outlet 16. Together with the detector 17, the ionization device 1 forms a mass spectrometer 20.

In order to displace the ionized gas 3a, 3a' to the outlet 16, the field generating device 13 is embodied to generate a further electric field E' between the further inlet 5 and the further outlet 14 as first electrode and the outlet 16, which serves as further (second) electrode. The further electric field E' is directed counter to the (first) electric field E in the propagation direction of the gas 3 to be ionized (X-direction). The voltage source 15 serves to generate the further electric field E' by applying a further voltage V' between the further inlet 5 and the further outlet 14, and the outlet 16. The positively charged ions of the ionized gas 3a, 3a' are accelerated toward the outlet 16 by the further electric field E. Here, the ions 3a, 3a' are accelerated along a further acceleration path d', which can be e.g. approximately 10 mm. Since the greatest part of the ionized gas 3a, 3a' is generated at the end of the cascade multiplication path, i.e. in the glow discharge zone 12, due to the maximum density of free electrons present there, the majority of the ionized gas 3a, 3a' can be drained toward the outlet 16.

In order to supply an ion stream to the detector 17 that is as constant as possible, it is advantageous to keep the pressure p as constant as possible in the secondary plasma region 10 or along the ignition path d between the inlet 2 and the further inlet 5 or the further outlet 14. In order to achieve this, the further outlet 14 is connected by way of a controllable valve 18 to a pumping-out device 19 (vacuum pump), which serves to pump the gas 3 to be ionized and the metastable particles 6a and/or the ions 6b of the ionization gas 6 out of the secondary plasma region 10. The valve 18 and the pumping-out device 19 are connected to a open-loop and closed-loop control device 21, which regulates the pressure p in the secondary plasma region 10 to a constant setpoint value.

In order to achieve this, the open-loop and closed-loop control device 21 can be connected to one or more sensors (not shown here), in particular pressure sensors, which render it possible to determine the pressure p in the secondary plasma region 10 either directly or possibly indirectly. The open-loop and closed-loop control device 21 also serves to actuate the field generating device 13 in such a way that an ignition voltage V, adapted to a respective gas species to be ionized, is generated for generating the electric field E or a suitably adapted punch-through voltage V' is generated for generating the further electric field E'.

In the ionization device 1 shown in FIG. 1a, it was found to be advantageous if the central axis of the inlet 2, which extends through the centre of the opening (aperture) 2a of the inlet 2, the secondary plasma region 10 or the glow discharge zone 12 and the central axis of the outlet 16, which extends through the centre of the aperture 16a of the outlet 16, are arranged along a common line of sight 22. It was also found to be advantageous if the central axis of the further inlet 5, which extends through the centre of the aperture 5a of the further inlet 5, the secondary plasma region 10 or the glow discharge zone 12 and the central axis of the further outlet 14, which extends through the centre of the aperture 14a of the further outlet 14, are arranged along a further common line of sight 23. It is advantageous if the further common line of sight 23 extends perpendicular to the (first) common line of sight since the further inlet 5 and the further outlet 14 are in this case arranged in a direction (Y-direction) perpendicular to the propagation direction of the gas 3 to be ionized.

FIG. 1b shows a mass spectrometer 20, which has an ionization device 1 that is substantially embodied as depicted in FIG. 1a. In contrast to the example shown in FIG. 1a, a chamber 25 serving to treat the gas 3 to be ionized in front of the inlet 2 and hence in front of the secondary plasma region 10 is arranged between the inlet 2 for the gas 3 to be ionized and a primary inlet 24 (with an aperture 24a) for the entry of the gas 3 to be ionized into the ionization device 1. The gas 3 to be ionized can be treated in various ways in the chamber 25:

By way of example, there can be a pressure reduction of the gas to be ionized in the chamber 25, i.e. the chamber 25 serves as e.g. a differentially pumped pressure stage, or—as shown in FIG. 1b—as a pressure stage pumped (pulsed) via a valve 26, for reducing the primary pressure $p_u$ in the environment outside of the ionization device 1, which pressure may e.g. be of the order of between approximately 1 bar and 200 bar. Depending on the primary pressure $p_u$, the pressure reduction in the chamber 25 can be brought about via a simple pressure stage or optionally by way of a plurality of pressure stages arranged in series within the chamber 25 in order to be able to carry out the ionization at a smaller pressure p of the gas 3 to be ionized.

There can also be thermal decoupling in the chamber 25 in order to ensure that the temperature of the gas 3 to be ionized, which enters from the environment disposed upstream of the primary inlet 24, does not exceed a fixedly predetermined maximum operating temperature in the (secondary) inlet 2 adjoining the chamber 25. The thermal decoupling can be brought about by thermal insulation (metal/ceramic transition), passive cooling (e.g. convection by way of cooling bodies), active cooling (e.g. air or water cooling), etc.

Additionally or alternatively, it is also possible to carry out foreign gas suppression, particle filtering and/or a particle treatment in the chamber 25 in order to convert the gas 3 to be ionized into a composition suitable for supply to the secondary plasma region 10. The particle treatment or particle filtering can be carried out e.g. in a mechanical or magnetic manner.

In the exemplary embodiment shown in FIG. 1b, the field generating device 13 is moreover embodied to generate a first and second time-dependent magnetic field M1, M2 in the secondary plasma region 10. In the shown example, the field generating device 13 is embodied to generate a first magnetic field M1 which is aligned along the first line of sight 22; i.e., the axis of symmetry of the first magnetic field M1 extends along the line of sight 22 (in the X-direction). The field generating device 13 has a first and a second coil 27a,b for generating the first magnetic field M1. The field generating device 13 is also embodied to generate a second magnetic field M2 which is aligned along the further line of sight 23; i.e., the axis of symmetry of the second magnetic field M2 extends along the further line of sight 23 (in the Y-direction). The field generating device 13 has two further coils 28a, 28b for generating the second magnetic field M2. The field generating device 13 is embodied to set the current flow through the coils 27a, 27b and through the further coils 28a, 28b or to control/regulate this via the open-loop and closed-loop control device 21 in order to suitably influence the magnetic fields M1, M2 which are present in the secondary plasma region 10. It is understood that the magnetic fields M1, M2 can also have an alignment that is different to what is depicted in FIG. 1b. The field generating device 13 can also optionally be embodied to generate one or more time-constant magnetic fields in the secondary plasma region 10 in addition or as an alternative to the generation of a time-varying magnetic field. To this end, the field generating device 13 can have one or more permanent magnets.

The magnetic fields M1, M2 can amplify the ionization in the secondary plasma region 10, for example by way of the "electron cyclotron resonance" (ECR) effect or by an "inductively coupled plasma" (ICP effect). By generating a time-dependent magnetic field M1, M2, it is possible to generate a time-dependent electric field in the secondary plasma region 10 which amplifies the plasma. The respective ionizing magnetic field M1, M2 can be generated by way of the coils 27a, 27b or by way of the further coils 28a, 28b. Typically, the field generating device 13 for generating the glow discharge 12 in the secondary plasma region 10 additionally has the voltage source 15, shown in FIG. 1a, for generating the electric field E or the further electric field E'.

The plasma, more precisely the glow discharge zone 12, can also be displaced in a targeted manner within the ionization device 1 with the aid of one or more magnetic fields M1, M2. By way of example, the first magnetic field M1 or the maximum of the magnetic field strength of the first magnetic field M1 can be shifted along the line of sight 22 in the direction of the inlet 2 by way of a suitable current flow through the coils 27a, 27b in order also to displace the glow discharge 12 in the direction of the inlet 2 such that the molecules of the gas 3 to be ionized are ionized there with the highest possible efficiency. Displacing the first magnetic field M1 in the direction of the outlet 16 can serve to design the conveyance of the ionized gas 3a, 3a' to the outlet 16 and to the detector 17 adjoining the latter in a manner that is as efficient as possible.

The displacement of the first magnetic field M1 (and also of the second magnetic field M2) can be brought about depending on the gas 3 to be ionized or on the gas species to be ionized, to the extent that these are known to the ionization device 1 or the open-loop and closed-loop control device 21. The time-dependent magnetic field or fields M1, M2 can also be modified or moved in a targeted manner during a measuring process of the ionized gas 3a, 3a' in the detector 17, leading to an increase in the ionization efficiency and/or to a more efficient conveyance of the ionized gas 3a, 3a' in the detector 17.

Figure 4:
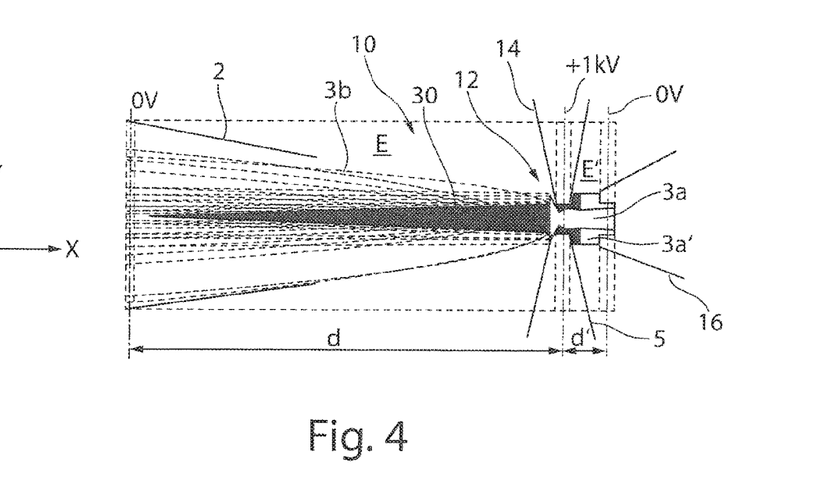
FIG. 4 shows a schematic illustration of simulated trajectories of ions of the gas to be ionized, which are generated in the ionization device.

FIG. 4 shows simulated trajectories of the ions 3a of the gas 3 to be ionized, which are generated by the cascade multiplication along the acceleration path d or by the glow discharge 12, and of the ions 3a' of the gas 3 to be ionized, which are generated by a charge-exchange or impact ionization with the metastable particles 6a and/or ions 6b of the ionization gas 6 (not shown in FIG. 4). To simplify matters, the inlet 2 was simulated as a plane, grid-shaped electrode extending in the Y-direction at a potential of 0 V. The further inlet 5 and the further outlet 14 were simulated as grid-shaped (hole) electrodes extending in the Y-direction at a potential of +1 kV. The outlet 16 was also simulated as a grid-shaped (hole) electrode extending in the Y-direction at a potential of 0 V. Earthing, or setting the potential of the outlet 16 to 0 V, was found to be advantageous since the detector 17 can also be placed to ground potential in this case. However, it is understood that the potential of the outlet 16 can also assume other (positive or negative) values, for example in the region of −100 V or less. The extent of the simulated electrodes is indicated in FIG. 4 by dashed rectangles.

As can clearly be seen in FIG. 4, the number of free electrons 30 significantly increases, proceeding from the inlet 2, in the direction of the glow discharge zone 12 due to the cascade multiplication such that a large number of ions 3a of the gas 3 to be ionized are generated there, which ions are accelerated in the direction of the outlet 16 due to the further electric field E'. The trajectories of ions 3b of the gas 3 to be ionized, which are already ionized along the acceleration path d and which are accelerated by the electric field E in the direction of the inlet 2 due to the positive charge thereof and which are therefore not available for analysis in the detector 17, can likewise be identified in FIG. 4. The ions 3a, 3a' of the gas 3 to be ionized are accelerated to the outlet 16 and analyzed together in the detector 17.

The use of the ionization device 1 described above is not restricted to a mass spectrometer 20 only; rather, the ions 3a, 3a' generated by the ionization device 1 can also be used in a useful manner in other apparatuses, in which ions 3a, 3a' or an ion beam are/is implemented, for example in an electron beam microscope or in an ion beam microscope. By way of example, electrons which are scattered back at an object to be examined in electron beam microscopy can be introduced into the ionization device 1 together with a gas 3 to be ionized, e.g. helium or water vapour, by way of the inlet 2. The electrons supplied by way of the inlet 2 serve to ionize the gas 3 to be ionized along the ignition path d, wherein the number of ions 3a of the gas 3 to be ionized generated in the process depends on the number of the electrons that entered into the ionization device 1 or on the electron current. A detector 17 (e.g. a light-sensitive amplifier or a charge amplifier) e.g. at ground potential or at a low potential near the ground potential can be disposed downstream of the output of the ionization device 1 in order to measure the current generated by the ions 3a, 3a' or the charge generated by the ions 3a, 3a'. Here, the acceleration or ignition path d in the ionization device 1 serves to amplify the ion current, which is generated by the electrons and detected by the detector 17. The gain generated by the ionization device 1 can be set or adjusted by the length of the ignition path d and the number of the supplied metastable particles 6a or of the ions 6b of the ionization gas 6.

What is claimed is:

1. An ionization device, comprising:
   a plasma generating device configured to generate a species in a primary plasma region;
   a field generating device configured to generate a glow discharge in a secondary plasma region;
   a first inlet configured to supply a gas to be ionized into the secondary plasma region;
   a second inlet configured to supply the species into the secondary plasma region; and
   a first outlet configured to discharge the ionized gas from the ionization device,
   wherein:
   the species comprises at least one member selected from the group consisting of metastable particles of an ionization gas and ions of the ionization gas; and
   the first inlet, the secondary plasma region and the first outlet are arranged along a line of sight.

2. The ionization device of claim 1, wherein the field generating device is configured to generate an electric field between the first and second inlets to generate the glow discharge in the secondary plasma region.

3. The ionization device of claim 2, wherein, to generate the electric field, the field generating device comprises a voltage source, a first electrode and a second electrode.

4. The ionization device of claim 3, wherein the first inlet defines the first electrode, and the second inlet defines the second electrode.

5. The ionization device of claim 3, wherein the voltage source is configured to generate a voltage of between 50 V and 5000 V between the first and second electrodes.

6. The ionization device of claim 1, wherein the field generating device is configured to generate a further electric field between the second inlet and the first outlet.

7. The ionization device of claim 6, wherein the first outlet defines an electrode configured to generate the further electric field.

8. The ionization device of claim 1, further comprising a pump comprising a second outlet configured to pump at least one member out of the secondary plasma region, wherein the at least one member is selected from the group consisting of the gas to be ionized and the species.

9. The ionization device of claim 8, wherein the second inlet and the second outlet are arranged along a line of sight.

10. The ionization device of claim 1, wherein the field generating device is configured to generate a magnetic field in the secondary plasma region.

11. The ionization device of claim 1, wherein the field generating device is configured to generate a time dependent magnetic field in the secondary plasma region.

12. The ionization device of claim 1, wherein:
the field generating device is configured to generate a magnetic field aligned along a line; and
one of the following holds:
the ionization device further comprises an outlet configured to discharge the ionized gas from the ionization device, and the inlet, the secondary plasma region and the outlet are also arranged along the line of sight; and
the ionization device further comprises a pump comprising an outlet configured to pump at least one member out of the secondary plasma region, the at least one member is selected from the group consisting of the gas to be ionized and the species, and the second inlet and the outlet are also arranged along the line of sight.

13. The ionization device of claim 1, further comprising a chamber between a primary inlet of the ionization device and the first inlet to treat the gas to be ionized prior to supplying the gas to be ionized into the secondary plasma region.

14. The ionization device of claim 1, wherein the ionization device is configured so that, during use of the ionization device, a pressure in the primary plasma region is greater than a pressure in the secondary plasma region.

15. The ionization device of claim 14, wherein at least one of the following holds:
the pressure in the primary plasma region is between 100 mbar and 1000 mbar; and
the pressure in the secondary plasma region is between 0.5 mbar and 10 mbar.

16. The ionization device of claim 1, wherein the ionization gas comprises a noble gas.

17. The ionization device of claim 1, wherein the plasma generating device is selected from the group consisting of a corona discharge plasma generating device and dielectric barrier discharge plasma generating device.

18. A mass spectrometer, comprising:
an ionization device according to claim 1; and
a detector downstream of the first outlet,
wherein the mass spectrometer is configured to mass-spectrometrically analyze the ionized gas.

19. An ionization device, comprising:
a plasma generating device configured to generate a species in a primary plasma region;
a field generating device configured to generate a glow discharge in a secondary plasma region;
a first inlet configured to supply a gas to be ionized into the secondary plasma region;
a second inlet configured to supply the species into the secondary plasma region; and
a pump comprising a second outlet configured to pump at least one member out of the secondary plasma region,
wherein:
the species comprises at least one member selected from the group consisting of metastable particles of an ionization gas and ions of the ionization gas;
the at least one member is selected from the group consisting of the gas to be ionized and the species; and
the second inlet and the second outlet are arranged along a line of sight.

20. A mass spectrometer, comprising:
an ionization device according to claim 19; and
a detector downstream of the first outlet,
wherein the mass spectrometer is configured to mass-spectrometrically analyze the ionized gas.

* * * * *

UNITED STATES PATENT AND TRADEMARK OFFICE
CERTIFICATE OF CORRECTION

PATENT NO. : 10,236,169 B2  
APPLICATION NO. : 15/617819  
DATED : March 19, 2019  
INVENTOR(S) : Michel Aliman et al.

Page 1 of 1

It is certified that error appears in the above-identified patent and that said Letters Patent is hereby corrected as shown below:

On the Title Page

Column 1, under Related U.S. Application Data, Line 2, delete "Mar. 12, 2015." and insert -- Dec. 03, 2015. --.

In the Specification

Column 6, Line 8-12, delete "The ionizing time-dependent magnetic field can also be modified or moved in a targeted manner in a measuring cell or in a detector during a measuring procedure of an analyte, which may lead to increasing the ionization or to more efficient conveyance of ions into the measuring cell." insert the same on Column 6, Line 7, as a continuation of the same paragraph.

Column 7, Line 44, delete "(micro-) valve," and insert -- (micro-)valve, --.

Signed and Sealed this  
Fourteenth Day of May, 2019

Andrei Iancu  
*Director of the United States Patent and Trademark Office*